United States Patent
Kwak et al.

(10) Patent No.: US 11,008,920 B2
(45) Date of Patent: May 18, 2021

(54) THERMOELECTRIC CONVERSION MODULE AND THERMOELECTRIC CONVERSION MODULE SYSTEM

(71) Applicants: Hyundai Motor Company, Seoul (KR); Kia Motors Corporation, Seoul (KR)

(72) Inventors: Jin Woo Kwak, Gyeongsan-si (KR); Kyung Wook Choi, Ansan-si (KR); Byung Wook Kim, Ansan-si (KR); Hoo Dam Lee, Seongnam-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 366 days.

(21) Appl. No.: 16/191,333

(22) Filed: Nov. 14, 2018

(65) Prior Publication Data

US 2020/0040794 A1 Feb. 6, 2020

(30) Foreign Application Priority Data

Jul. 31, 2018 (KR) .................. 10-2018-0089371

(51) Int. Cl.
*F01N 5/02* (2006.01)
*H01L 35/22* (2006.01)
*H01L 35/30* (2006.01)
*F01N 3/02* (2006.01)

(52) U.S. Cl.
CPC .......... *F01N 5/025* (2013.01); *F01N 3/0205* (2013.01); *H01L 35/22* (2013.01); *H01L 35/30* (2013.01)

(58) Field of Classification Search
None
See application file for complete search history.

(56) References Cited

U.S. PATENT DOCUMENTS

| | | | |
|---|---|---|---|
| 2005/0072142 A1 | 4/2005 | Sasaki et al. | |
| 2009/0126772 A1 | 5/2009 | Machida | |
| 2012/0125015 A1* | 5/2012 | Renze | F25B 21/02 62/3.7 |
| 2013/0104951 A1* | 5/2013 | Savelli | H01L 35/32 136/203 |
| 2013/0186448 A1 | 7/2013 | Ranalli et al. | |

FOREIGN PATENT DOCUMENTS

EP 1522685 A1 4/2005

* cited by examiner

*Primary Examiner* — Magali P Slawski
(74) *Attorney, Agent, or Firm* — Morgan, Lewis & Bockius LLP

(57) ABSTRACT

A thermoelectric conversion module may include a plurality of n-type thermoelectric conversion elements and a plurality of p-type thermoelectric conversion elements alternating with one another, a plurality of first electrodes and a plurality of second electrodes that alternately connect the plurality of alternating n-type and p-type thermoelectric conversion elements at hot sides and cool sides, and a plurality of case electrodes, each of which selectively connects the first electrodes adjacent to each other, among the plurality of first electrodes. The first electrodes and the case electrodes are configured to be movable relative to each other so that the plurality of first electrodes are electrically connected through the plurality of case electrodes or electrical connections between the plurality of first electrodes through the plurality of case electrodes are disabled according to a relative movement of the plurality of first electrodes and the plurality of case electrodes.

19 Claims, 6 Drawing Sheets

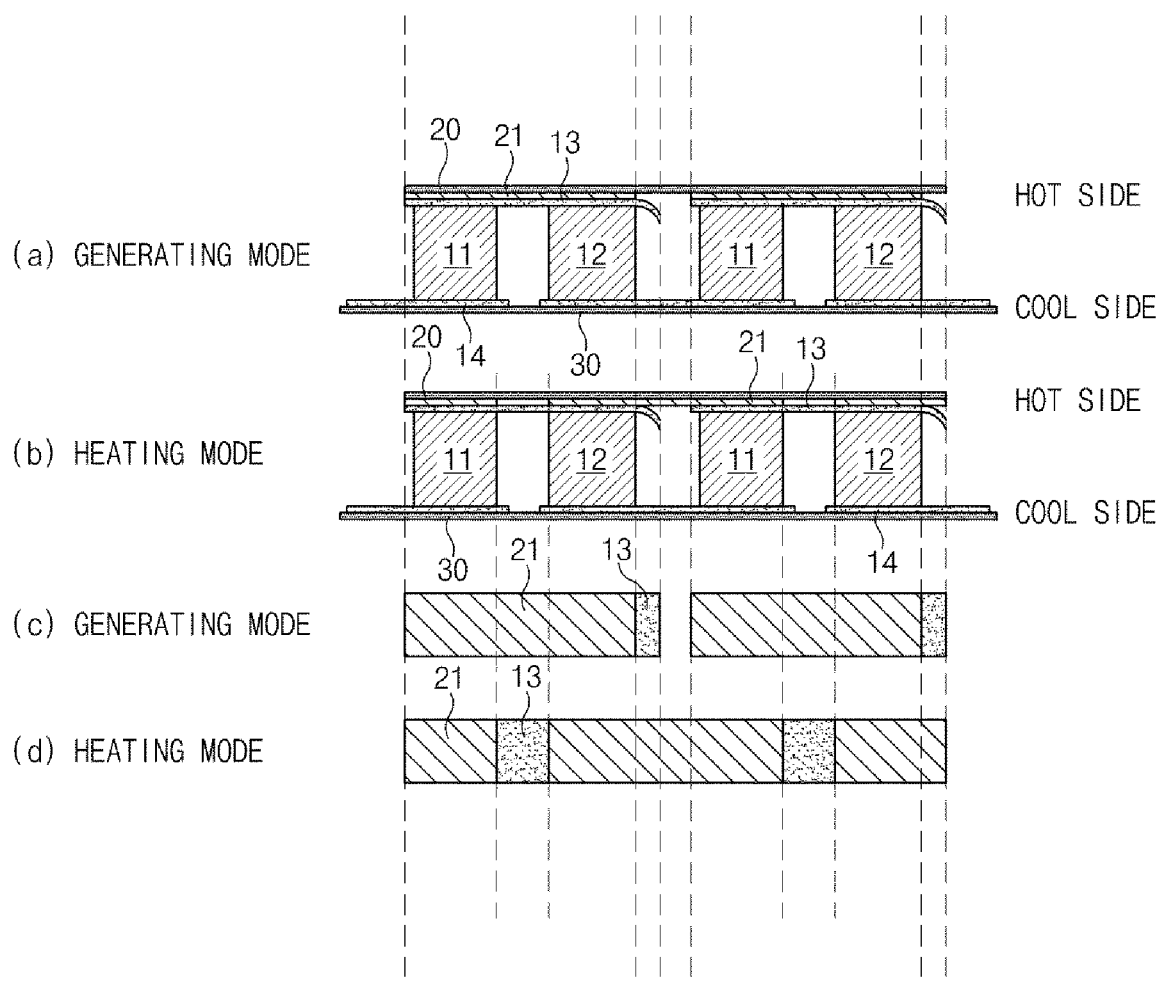

THERMOELECTRIC CONVERSION MODULE AND THERMOELECTRIC CONVERSION MODULE SYSTEM

CROSS-REFERENCE TO RELATED APPLICATION

The present application claims priority to Korean Patent Application No. 10-2018-0089371, filed on Jul. 31, 2018, the entire contents of which is incorporated herein for all purposes by this reference.

BACKGROUND OF THE INVENTION

Field of the Invention

The present invention relates to a thermoelectric conversion module and a thermoelectric conversion module system.

Description of Related Art

A thermoelectric module is employed in a thermoelectric generator system using the Seebeck effect, in which the thermoelectric module generates an electromotive force by use of a temperature difference on opposite sides thereof.

When the thermoelectric module is used for power generation, the output of the thermoelectric power generation may be increased by maintaining a significant temperature difference between a hot side and a cool side thereof. In the instant case, the rate of heat transfer from a heat source to the thermoelectric module has a great effect on the output of the power generation.

For example, the thermoelectric module may be employed in the field of generating electric power using waste heat from an exhaust system of a vehicle.

Meanwhile, the exhaust system of the vehicle may include a selective catalyst reduction (SCR) for reducing emissions. The SCR has a reduction effect in emission at a predetermined temperature or higher. However, the reduction effect in emission may be deteriorated in an initial stage of engine start-up since the SCR is at low temperature.

Furthermore, when the thermoelectric module is disposed closer to an engine than the SCR on the exhaust system for thermoelectric power generation, the thermoelectric module takes away heat in emissions that flow into the SCR, and therefore it may take much time for the SCR to reach the predetermined temperature.

To overcome the above mentioned problems, an improved thermoelectric module is required that performs thermoelectric power generation by use of waste heat in emissions and increases a reduction effect in emission by heating a selective catalyst reduction (SCR) in an initial stage of engine start-up.

The information included in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing a thermoelectric conversion module which is configured for selectively operating in a generating mode for thermoelectric power generation or a heating mode for heating a selective catalyst reduction (SCR).

The technical problems to be solved by the present inventive concept are not limited to the aforementioned problems, and any other technical problems not mentioned herein will be clearly understood from the following description by those skilled in the art to which the present invention pertains.

According to various aspects of the present invention, a thermoelectric conversion module according to an exemplary embodiment of the present invention may include a plurality of n-type thermoelectric conversion elements and a plurality of p-type thermoelectric conversion elements alternating with one another, a plurality of first electrodes and a plurality of second electrodes that alternately connect the plurality of alternating n-type and p-type thermoelectric conversion elements at hot sides and cool sides, and a plurality of case electrodes, each of which selectively connects the first electrodes adjacent to each other, among the plurality of first electrodes.

The plurality of first electrodes and the plurality of case electrodes are configured to be movable relative to each other so that the plurality of first electrodes are electrically connected through the plurality of case electrodes or electrical connections between the plurality of first electrodes through the plurality of case electrodes are disabled according to a relative movement of the plurality of first electrodes and the plurality of case electrodes.

The methods and apparatuses of the present invention have other features and advantages which will be apparent from or are set forth in more detail in the accompanying drawings, which are incorporated herein, and the following Detailed Description, which together serve to explain certain principles of the present invention.

BRIEF DESCRIPTION OF THE DRAWINGS

FIG. 2 illustrates operating modes of the thermoelectric conversion module according to an exemplary embodiment of the present invention;

Figure 1:
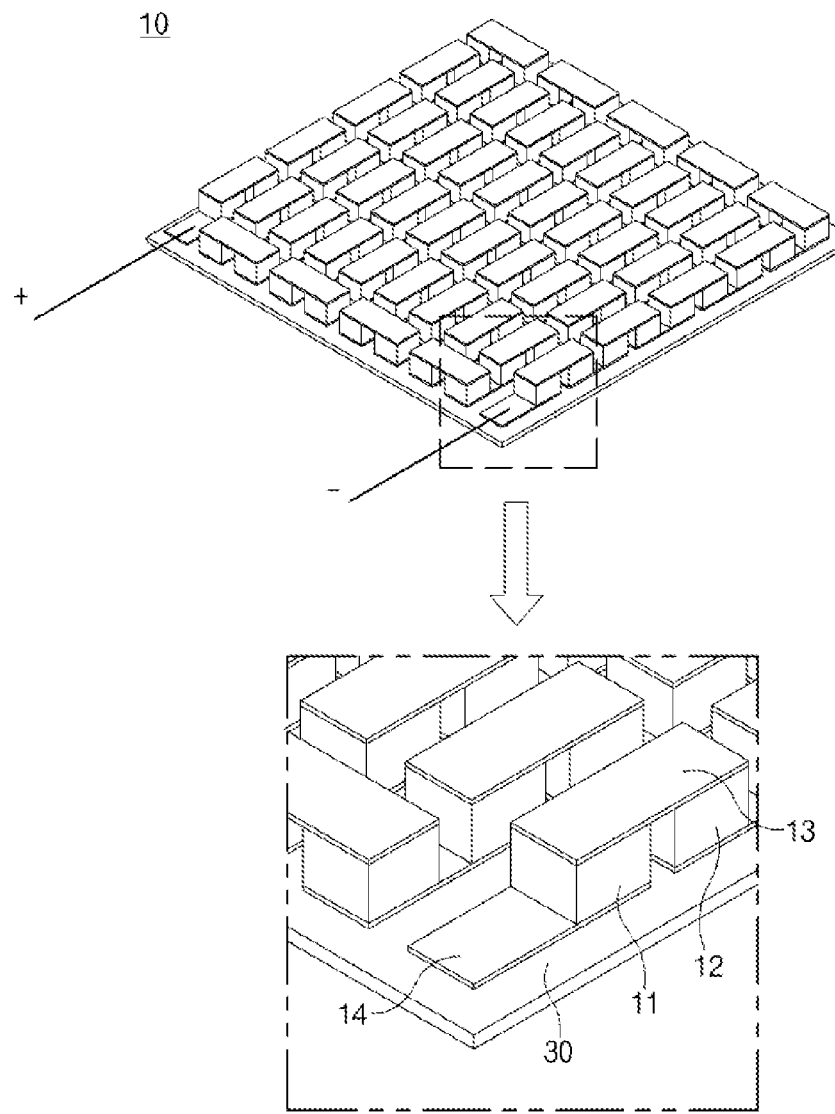
FIG. 1 illustrates a thermoelectric conversion unit of a thermoelectric conversion module according to an exemplary embodiment of the present invention.

It may be understood that the appended drawings are not necessarily to scale, presenting a somewhat simplified representation of various features illustrative of the basic principles of the present invention. The specific design features of the present invention as included herein, including, for example, specific dimensions, orientations, locations, and shapes will be determined in part by the particularly intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the present invention(s) will be described in conjunction with exemplary embodiments of the present invention, it will be understood that the present description is not intended to limit the present invention(s) to those exemplary embodiments. On the other hand, the present invention(s) is/are intended to cover not only the exemplary embodiments of the present invention, but also various alternatives, modifications, equivalents and other embodiments, which may be included within the spirit and scope of the present invention as defined by the appended claims.

Hereinafter, various exemplary embodiments of the present invention will be described in detail with reference to the accompanying drawings. It may be understood that even if shown in different drawings, identical elements are provided with identical reference numerals in the drawings. Furthermore, in describing the exemplary embodiments of the present invention, detailed descriptions related to well-known functions or configurations will be omitted when they may make subject matters of the present invention unnecessarily obscure.

FIG. 1 illustrates a thermoelectric conversion unit of a thermoelectric conversion module according to an exemplary embodiment of the present invention.

The thermoelectric conversion module according to the exemplary embodiment of the present invention may include an internal module 10 including thermoelectric conversion elements 11 and 12, and a case 20 including case electrodes 21 and 22.

Referring to FIG. 1, the internal module 10 may include a plurality of n-type thermoelectric conversion elements 11 and a plurality of p-type thermoelectric conversion elements 12 alternating with one another.

The plurality of n-type thermoelectric conversion elements 11 and the plurality of p-type thermoelectric conversion elements 12 may be provided such that the n-type and p-type thermoelectric conversion elements 11 and 12 are alternately disposed on a rectangular plate of FIG. 1 in a first direction and then in a second direction which is opposite to the first direction thereof, and are alternately disposed again on the plate in the first direction thereof. In other words, the plurality of n-type thermoelectric conversion elements 11 and the plurality of p-type thermoelectric conversion elements 12 may be disposed in zig-zags on the plate and may be connected in series from (+) to (−) of FIG. 1 by a plurality of electrodes 13 and 14.

Referring to a blowup in FIG. 1, the internal module 10 may include a plurality of hot-side electrodes 13 and a plurality of cool-side electrodes 14 that alternately connect the plurality of alternating thermoelectric conversion elements 11 and 12 at hot sides and cool sides thereof.

In FIG. 1, top sides and bottom sides of the thermoelectric conversion elements 11 and 12 may correspond to the hot sides and the cool sides, respectively. The plurality of thermoelectric conversion elements 11 and 12 may vertically extend and may be connected at distal end portions thereof on the hot sides by the hot-side electrodes 13 and at distal end portions thereof on the cool sides by the cool-side electrodes 14.

The plurality of thermoelectric conversion elements 11 and 12 and the plurality of electrodes 13 and 14 may be disposed on an internal plate 30.

The cool-side electrodes 14 may be disposed in rows and columns on a surface of the internal plate 30.

The plurality of thermoelectric conversion elements 11 and 12 may be disposed in rows and columns on the plurality of cool-side electrodes 14.

The hot-side electrodes 13 may be disposed in rows and columns to connect the distal end portions on the hot sides of the plurality of thermoelectric conversion elements 11 and 12 that are disposed on the internal plate 30.

The internal plate 30 may correspond to a substrate of a thermoelectric conversion module in the related art. The internal plate 30 may be formed of various materials included in the related art or may have various shapes included in the related art.

For example, the internal plate 30 may be formed of a ceramic material to have insulation and durability. For example, the internal plate 30 may have recesses that are concavely formed in a shape corresponding to the cool-side electrodes 14 and in which the cool-side electrodes 14 are placed. Therefore, the internal plate 30 may guide the arrangement positions of the cool-side electrodes 14 and the plurality of thermoelectric conversion elements 11 and 12 and may allow the cool-side electrodes 14 and the plurality of thermoelectric conversion elements 11 and 12 to be securely coupled to the internal plate 30.

The thermoelectric conversion module may be employed in various fields to use waste heat. For example, the thermoelectric conversion module may be employed in the field of using heat in emissions that are discharged to the outside through an exhaust system of a vehicle. To use heat in emissions from the vehicle, the thermoelectric conversion module may be attached to any portion of the exhaust system. For example, the thermoelectric conversion module may be attached to an emission reduction apparatus.

However, generally, a thermoelectric conversion module attached to an emission reduction apparatus takes heat from the emission reduction apparatus before the temperature of the emission reduction apparatus sufficiently increases, causing deterioration in an emission reduction effect. Such a problem may take place even when the thermoelectric conversion module is disposed closer to an engine than the emission reduction apparatus on the exhaust system.

For example, a selective catalyst reduction (SCR) remain at a predetermined temperature or higher to effectively reduce emissions. However, in the case where a thermoelectric conversion module is disposed on the outside of the SCR, the thermoelectric conversion module takes thermal energy from the SCR before the SCR is sufficiently heated by heat in emissions in an initial stage of engine start-up, causing deterioration in emission reduction efficiency.

The present invention relates to a thermoelectric conversion module that selectively operates in a generating mode or a heating mode. The thermoelectric conversion module according to the exemplary embodiment of the present invention may selectively generate electric power by use of thermoelectric conversion or may generate heat by use of Joule heat. To achieve this, the thermoelectric conversion module is basically characterized in that the thermoelectric conversion module may include the hot-side electrodes 13 connecting the plurality of thermoelectric conversion elements 11 and 12 at the hot sides thereof and the case electrodes 21 and 22 connecting the hot-side electrodes 13, and the plurality of hot-side electrodes 13 and the plurality of case electrodes 21 and 22 are movable relative to each other. Accordingly, the thermoelectric conversion module may generate electric power by use of thermoelectric conversion, as in a general thermoelectric conversion module, while the hot-side electrodes 13 are not connected by the case electrodes 21 and 22, and may generate Joule heat in the same manner as that of an electric heater while the hot-side electrodes 13 are connected together by the case electrodes 21 and 22.

The features of the thermoelectric conversion module according to the exemplary embodiment of the present invention will be described below in more detail.

As illustrated in FIG. 1, the plurality of n-type thermoelectric conversion elements 11 and the plurality of p-type thermoelectric conversion elements 12 of the internal module 10 may be spaced from each other with an empty space in-between. Alternatively, insulators may be disposed between the plurality of n-type thermoelectric conversion elements 11 and the plurality of p-type thermoelectric conversion elements 12.

No special limitation applies to the shape of the internal module 10 according to an exemplary embodiment of the present invention, as long as the hot-side electrodes 13 are exposed on one side of the internal module 10 to make contact with the case electrodes 21 and 22 and the internal module 10 slides to enable or disable connections between the plurality of hot-side electrodes 13 through the case electrodes 21 and 22. Furthermore, the arrangement structure of the plurality of n-type thermoelectric conversion elements 11, the plurality of p-type thermoelectric conversion elements 12, and the plurality of cool-side electrodes 14 is not limited to those illustrated in FIG. 1 and the following drawings and may be changed into various structures included in the related art.

Figure 3A:
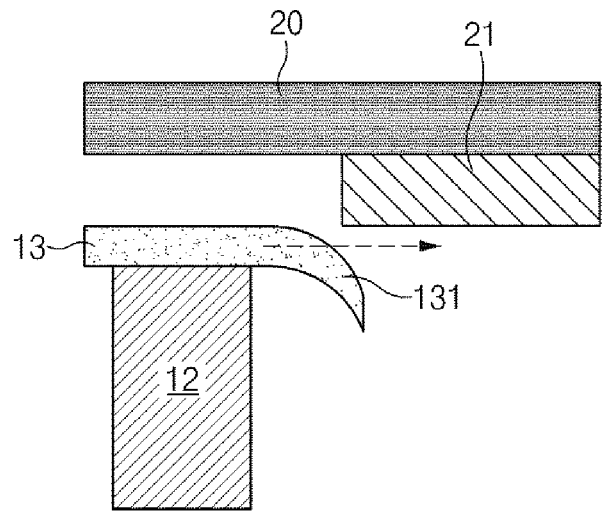
FIG. 3A and FIG. 3B are an enlarged view of a portion of FIG. 2.
Figure 3B:
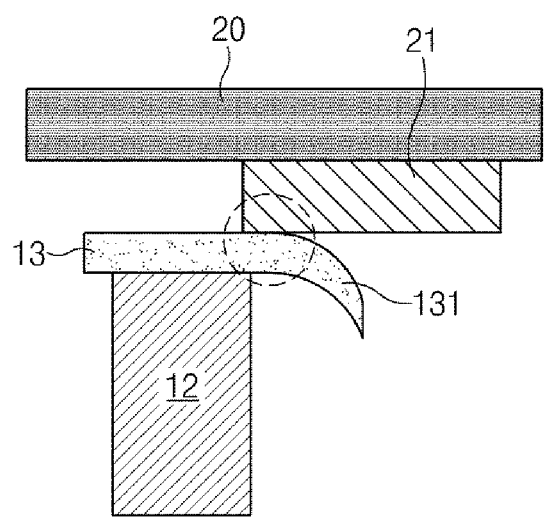

FIG. 2 illustrates operating modes of the thermoelectric conversion module according to an exemplary embodiment of the present invention, and FIG. 3A and FIG. 3B are an enlarged view of a portion of FIG. 2.

Hereinafter, how the plurality of hot-side electrodes 13 are electrically connected to or disconnected from one another by the plurality of case electrodes 21 and 22 will be described with reference to FIGS. 2, 3A and 3B.

The (a) and (b) in FIG. 2 illustrate that the internal module 10 is located in a second position.

When the internal module 10 is located in the second position, the case electrodes 21 (specifically, the row-wise case electrodes) may be superimposed on the hot-side electrodes 13, respectively. The hot-side electrodes 13 may receive thermal energy from a heat source on a hot side through the case electrodes 21.

The cool-side electrodes 14 may make contact with the internal plate 30 and may release the thermal energy to a cool side through the internal plate 30.

Accordingly, temperature gradients may be established from the hot sides to the cool sides in the plurality of n-type thermoelectric conversion elements 11 and the plurality of p-type thermoelectric conversion elements 12, and thermoelectric conversion may be performed according to the Seebeck effect to produce electric power.

For improving thermoelectric conversion performance of the above-configured thermoelectric conversion module, the greater the temperature differences between the hot sides and the cool sides of the thermoelectric conversion elements 11 and 12, the better. That is, to increase heat transfer from the heat source on the hot side, the higher the thermal conductivities of the hot-side electrodes 13 and the case electrodes 21, the better. Furthermore, to increase the amount of heat released to the cool side, the higher the thermal conductivities of the cool-side electrodes 14 and the internal plate 30, the better.

For example, the hot-side electrodes 13 and the cool-side electrodes 14 may be formed of copper with high thermal conductivity. Furthermore, the case electrodes 21 and 22 may also be formed of copper to effectively transfer heat supplied from the heat source on the hot side, to the hot-side electrodes 13.

The (b) and (d) in FIG. 2 illustrate that the internal module 10 is located in a first position.

The internal plate 30 may slide in the case 20, and thus the internal module 10 may move from the second position to the first position or from the first position to the second position.

When the internal module 10 is located in the first position, each of the case electrodes 21 and 22 may overlap two adjacent hot-side electrodes 13. In other words, when the internal module 10 is located in the first position, each of the case electrodes 21 and 22 may electrically connect two adjacent hot-side electrodes 13.

In the instant case, an electrical current supplied to the thermoelectric conversion module may flow along the hot-side electrodes 13 and the case electrodes 21 and 22 since the resistances of the thermoelectric conversion elements 11 and 12 are higher than the resistances of the electrodes (the case electrodes 21 and 22 and the hot-side electrodes 13). That is, while the internal module 10 is located in the first position, the hot-side electrodes 13 and the case electrodes 21 and 22 may provide a conductor through which the electrical current substantially flows.

The conductor may preferably have high resistance to increase the amount of heat released from the thermoelectric conversion module. That is, the hot-side electrodes 13 and/or the case electrodes 21 and 22 may have high resistance to increase Joule heat which is generated by the electrical current flowing into the thermoelectric conversion module. However, if the electric resistance of the hot-side electrodes 13 or the case electrodes 21 and 22 increases (that is, the electric conductivity thereof decreases), an effect of heat transfer from the hot-side electrodes 13 may deteriorate when the thermoelectric conversion module operates in a generating mode, since the electric conductivity and the thermal conductivity of a material have a similar aspect.

Therefore, materials and shapes of the case electrodes 21 and 22 may be determined in view of properties of the thermoelectric conversion elements 11 and 12, an average amount of heat to be supplied from the heat source on the hot side, a target amount of heat to be released from the thermoelectric conversion module, and the like.

For example, in the case where weight is placed on power generation performance of the thermoelectric conversion module, the hot-side electrodes 13 and the case electrodes 21 and 22 may be formed of a material with high thermal conductivity, such as copper.

In another example, in the case where weight is placed on heating performance of the thermoelectric conversion module, the case electrodes 21 and 22 may be formed of a material with higher resistance per unit area than the hot-side electrodes 13.

FIG. 3A and FIG. 3B illustrate a structure for preventing damage to contacting portions at which the hot-side electrodes 13 and the case electrodes 21 (the row-wise case electrodes) make contact with each other when the internal module 10 moves.

The plurality of hot-side electrodes 13 and/or the plurality of case electrodes 21 may have rounded edge portions at which the hot-side electrodes 13 and the case electrodes 21 make contact with each other when the internal plate 30 moves.

Referring to FIG. 3A and FIG. 3B, each of the hot-side electrodes 13 may have a hot-side electrode protrusion 131 formed at one end portion thereof that makes contact with the corresponding case electrode 21 when the internal module 10 moves relative to the case 20.

The one end portion of the hot-side electrode 13, which makes contact with the case electrode 21 when the internal plate 30 moves, may further extend in the direction in which the hot-side electrode 13 extends, and may be curved in a direction away from the case electrode 21.

That is, the one end portion of the hot-side electrode 13 may further extend in the movement direction of the internal plate 30 to form the hot-side electrode protrusion 131, and the hot-side electrode protrusion 131 may be curved toward an opposite side which is opposite to one side of the hot-side electrode 13 on which the case electrode 21 is located. Furthermore, the hot-side electrode protrusion 131 may have a smooth portion that makes contact with the case electrode 21, thus minimizing impact on the hot-side electrode 13 when the hot-side electrode 13 makes contact with the case electrode 21.

Accordingly, even though the hot-side electrode 13 and the case 20 become close to each other due to manufacturing tolerance or vibration, the hot-side electrode 13 and the case electrode 21 may be guided by the hot-side electrode protrusion 131 to move while forming a contact surface in-between, and damage to the hot-side electrode 13 or the case electrode 21 may be prevented.

Figure 4A:
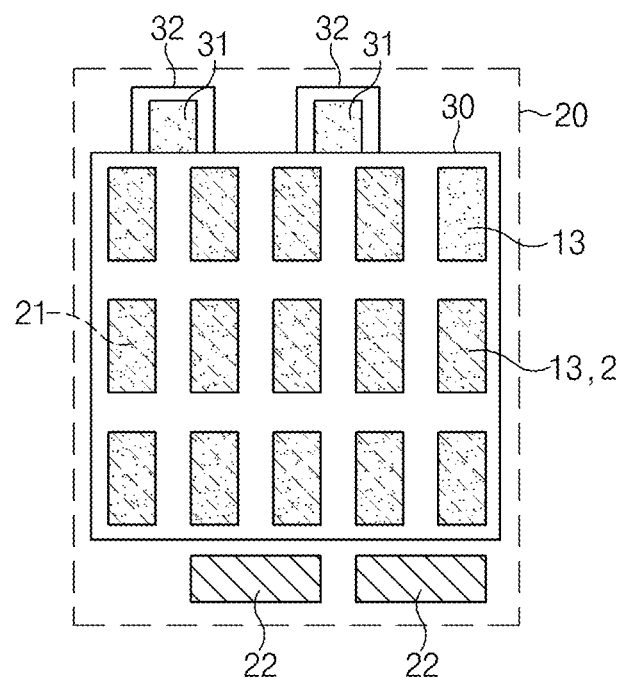
FIG. 4A, FIG. 4B and FIG. 4C illustrates operating modes of the thermoelectric conversion module according to an exemplary embodiment of the present invention.
Figure 4B:
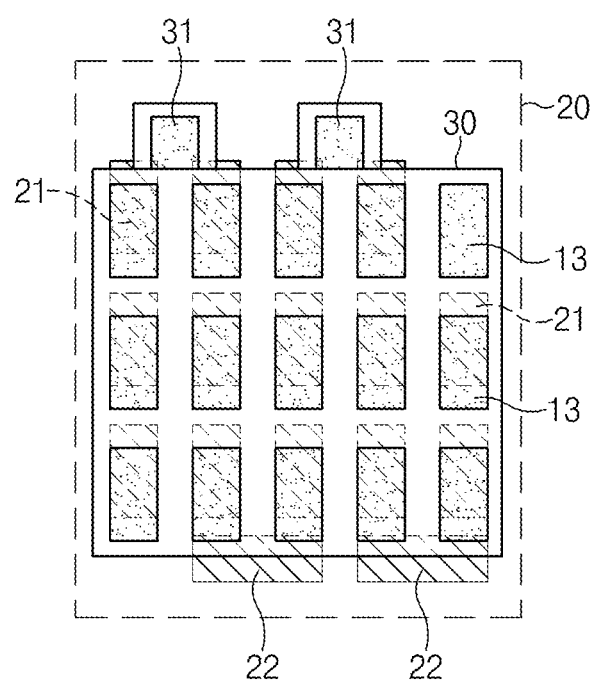
Figure 4C:
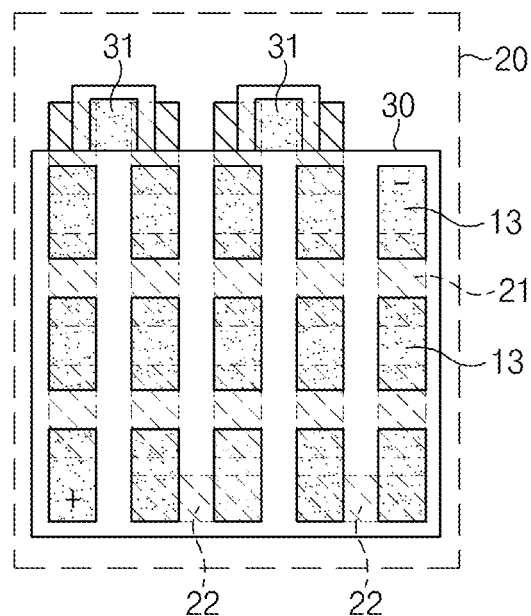

FIG. 4A, FIG. 4B and FIG. 4C illustrate operating modes of the thermoelectric conversion module according to an exemplary embodiment of the present invention.

Hereinafter, a method for moving the electrodes in the thermoelectric conversion module according to the exemplary embodiment of the present invention will be conceptually described with reference to FIGS. 4A-4C. The structure illustrated in FIGS. 4A-4C is provided to help a better understanding of the present invention, and the thermoelectric conversion module may actually include a larger number of hot-side electrodes 13, case electrodes 21 and 22, and sub-electrodes 31, which are disposed to be described below.

Referring to FIG. 4A, the plurality of case electrodes 21 (the row-wise case electrodes) may be superimposed on the plurality of hot-side electrodes 13, respectively, when the internal module 10 is located in the second position (see FIG. 4A) for thermoelectric power generation.

The plurality of hot-side electrodes 13 may be disposed in rows and columns over the internal plate 30.

For example, in FIG. 4A, the vertical direction in which the internal plate 30 slides may be defined as a row direction and the horizontal direction perpendicular to the row direction may be defined as a column direction thereof. The plurality of hot-side electrodes 13 may be disposed in a matrix form with five rows and three columns over the internal plate 30. When the plurality of hot-side electrodes 13 are disposed over the internal plate 30, it means that the plurality of hot-side electrodes 13 are not in direct contact with the internal plate 30, but connected to the internal plate 30 through the plurality of thermoelectric conversion elements 11 and 12.

The case electrodes 21 and 22 may include the plurality of row-wise case electrodes 21 and the plurality of column-wise case electrodes 22.

The plurality of row-wise case electrodes 21 may be superimposed on the plurality of hot-side electrodes 13, respectively, when the internal plate 30 is located in the second position (see FIG. 4A).

The plurality of row-wise case electrodes 21 may extend in the row direction in which the plurality of hot-side electrodes 13 extend, and may form contact surfaces with the plurality of hot-side electrodes 13.

The plurality of row-wise case electrodes 21 may have a size corresponding to the hot-side electrodes 13 and may be formed in positions corresponding thereto, such that the plurality of row-wise case electrodes 21 are superimposed on the plurality of hot-side electrodes 13 in a one-to-one manner while the internal plate 30 is located in the second position (see FIG. 4A). For example, each of the row-wise case electrodes 21 may be formed in a rectangular plate shape that corresponds to the remaining portion of the hot-side electrode 13 except for the hot-side electrode protrusion 131.

Accordingly, in a generating mode, the hot-side electrodes 13 and the row-wise case electrodes 21 may have large contact surfaces in-between, so that heat supplied from the heat source on the hot side may be effectively transferred to the hot-side electrodes 13 through the row-wise case electrodes 21.

The same number of row-wise case electrodes 21 as the hot-side electrodes 13, or the row-wise case electrodes 21 one or two fewer than the number of hot-side electrodes 13, may be provided to electrically connect the plurality of hot-side electrodes 13.

The plurality of column-wise case electrodes 22 may be located on one side of the plurality of hot-side electrodes 13 in the row direction so as not to overlap the plurality of hot-side electrodes 13 when the internal plate 30 is located in the second position (see FIG. 4A). That is, the plurality of column-wise case electrodes 22 may be located on one side of the plurality of hot-side electrodes 13 in the movement direction of the internal plate 30, based on the state in which the internal plate 30 is located in the second position (see FIG. 4A).

The plurality of column-wise case electrodes 22 may have a rectangular plate shape that extends in the column direction in which the plurality of hot-side electrodes 13 are disposed.

The plurality of column-wise case electrodes 22 may form contact surfaces to connect the hot-side electrodes 13 adjacent to each other in the column direction thereof, among the plurality of hot-side electrodes 13, when the internal plate 30 is located in the first position (see FIG. 4C).

The number of column-wise case electrodes 22 may be represented by the following equation. (the number of rows of hot-side electrodes being an odd number) the number of culumn–

$$\text{wise case electrode} = \frac{\text{the number of rows of hot-side electrodes}}{2}$$

For example, in the case where the plurality of hot-side electrodes 13 are disposed in five rows, the number of column-wise case electrodes 22 is two.

Alternatively, when the number of rows of the hot-side electrodes 13 is an even number, the number of column-wise case electrodes 22 may correspond to half the number of rows of the hot-side electrodes 13.

For example, in the case where the plurality of hot-side electrodes 13 are disposed in six rows, the number of column-wise case electrodes 22 is three.

The internal plate 30 may include the sub-electrodes 31 located on an opposite side of the plurality of hot-side electrodes 13 which is opposite to the one side on which the plurality of column-wise case electrodes 22 are located when the internal plate 30 is in the second position (see FIG. 4A). That is, the sub-electrodes 31 may be located on the opposite side of the plurality of hot-side electrodes 13 in the row direction thereof, which is opposite to the one side in the row direction on which the column-wise case electrodes 22 are disposed.

The sub-electrodes 31 may be mounted on the internal plate 30 to connect the case electrodes 21 adjacent to each other in the column direction thereof, among the plurality of case electrodes 21, when the internal plate 30 moves to the first position (see FIG. 4C).

The sub-electrodes 31 may be formed of the same material as that of the hot-side electrodes 13. A. Alternatively, the sub-electrodes 31 may be formed of a material with higher resistance per unit area than the hot-side electrodes 13 to effectively generate Joule heat.

The internal plate 30 may include internal-plate protrusions 32 that extend from the internal plate 30 in the row direction in which the plurality of hot-side electrodes 13 are disposed.

The internal-plate protrusions 32 may protrude toward the case 20 from one side of the internal plate 30.

As described above, only the portions required for disposing the sub-electrodes 31 may extend from the internal plate 30, which makes it possible to make the internal plate 30 compact. Furthermore, a member for moving the internal plate 30, such as a thermal actuator 40 or a spring 50 to be described below, may be disposed between the internal-plate protrusions 31. As a result, it is possible to fix the position of the member for moving the internal plate 30, protect the member from external impact or foreign matter, and prevent separation of the member from the internal plate 30.

The sub-electrodes 31 may be disposed on the internal-plate protrusions 32 to make contact with the row-wise case electrodes 21.

FIG. 4B illustrates that the internal plate 30 is located between the second position (see FIG. 4A) and the first position (see FIG. 4C), and FIG. 4C illustrates that the internal plate 30 is located in the first position.

When the internal plate 30 is located in the first position (see FIG. 4C), the plurality of hot-side electrodes 13 may be connected together in the row direction by the row-wise case electrodes 21 and in column direction by the column-wise case electrodes 22.

Furthermore, when the internal plate 30 is located in the first position (see FIG. 4C), the row-wise case electrodes 21 may be connected together in the column direction by the sub-electrodes 31.

Accordingly, as illustrated in FIG. 4C, the plurality of hot-side electrodes 13, the plurality of case electrodes 21 and 22, and the sub-electrodes 31 may be connected in series in zig-zags.

In general, under the same condition, the resistance of conductors is higher when the conductors are connected in series than when the conductors are connected in parallel. Therefore, heating by Joule heat may effectively take place in the thermoelectric conversion module, by connecting the plurality of hot-side electrodes 13 and the plurality of case electrodes 21 and 22 in series.

Figure 5:
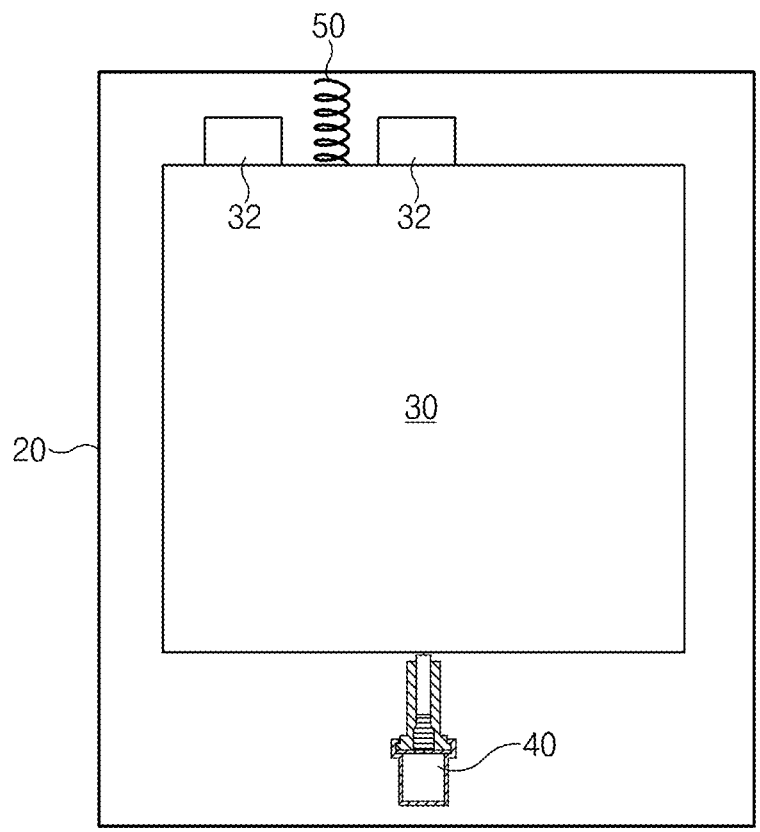
FIG. 5 illustrates a configuration for moving an internal module of the thermoelectric conversion module according to an exemplary embodiment of the present invention.

FIG. 5 illustrates a configuration for moving the internal module of the thermoelectric conversion module according to an exemplary embodiment of the present invention.

The thermoelectric conversion module may include an actuator for moving the internal plate 30. Any actuator configured for rectilinearly moving the internal plate 30 may be used as the actuator without any specific limitation.

For example, the actuator may be the thermal actuator 40. The thermal actuator 40 is advantageous in that the material inside the thermal actuator 40 expands or contracts depending on the ambient temperature and the thermal actuator 40 is driven without a separate power supply.

The thermoelectric conversion module according to the exemplary embodiment of the present invention may be disposed on a selective catalyst reduction (SCR) of the vehicle to operate in a heating mode or a generating mode, depending on the temperature of the SCR. In the instant case, the thermoelectric conversion module may be configured such that the operating mode of the thermoelectric conversion module is varied depending on temperature by the thermal actuator 40.

To apply elastic force to the internal plate 30, the thermoelectric conversion module may further include an elastic member attached to an opposite side of the internal plate 30 which is opposite to one side to which the thermal actuator 40 is attached. For example, the elastic member may be the spring 50.

The spring 50 may be attached to the opposite side of the internal plate 30, which is opposite to the one side to which the thermal actuator 40 is attached, to apply elastic force to move the internal plate 30.

When an actuating portion of the thermal actuator 40 extends to move the internal plate 30, the spring 50 may be compressed, and when the actuating portion of the thermal actuator 40 retracts, the internal plate 30 is moved by the spring 50. That is, when the internal plate 30 moves in one direction thereof, external force exerted on the internal plate 30 by the thermal actuator 40 may be greater than the force of the spring 50, and when the internal plate 30 moves in an opposite direction thereof, external force exerted on the internal plate 30 by the spring 50 may be greater than the force of the thermal actuator 40. Accordingly, the spring 50 may function as a damper and may apply restoring force, facilitating the internal plate 30 to move stably.

Figure 6:
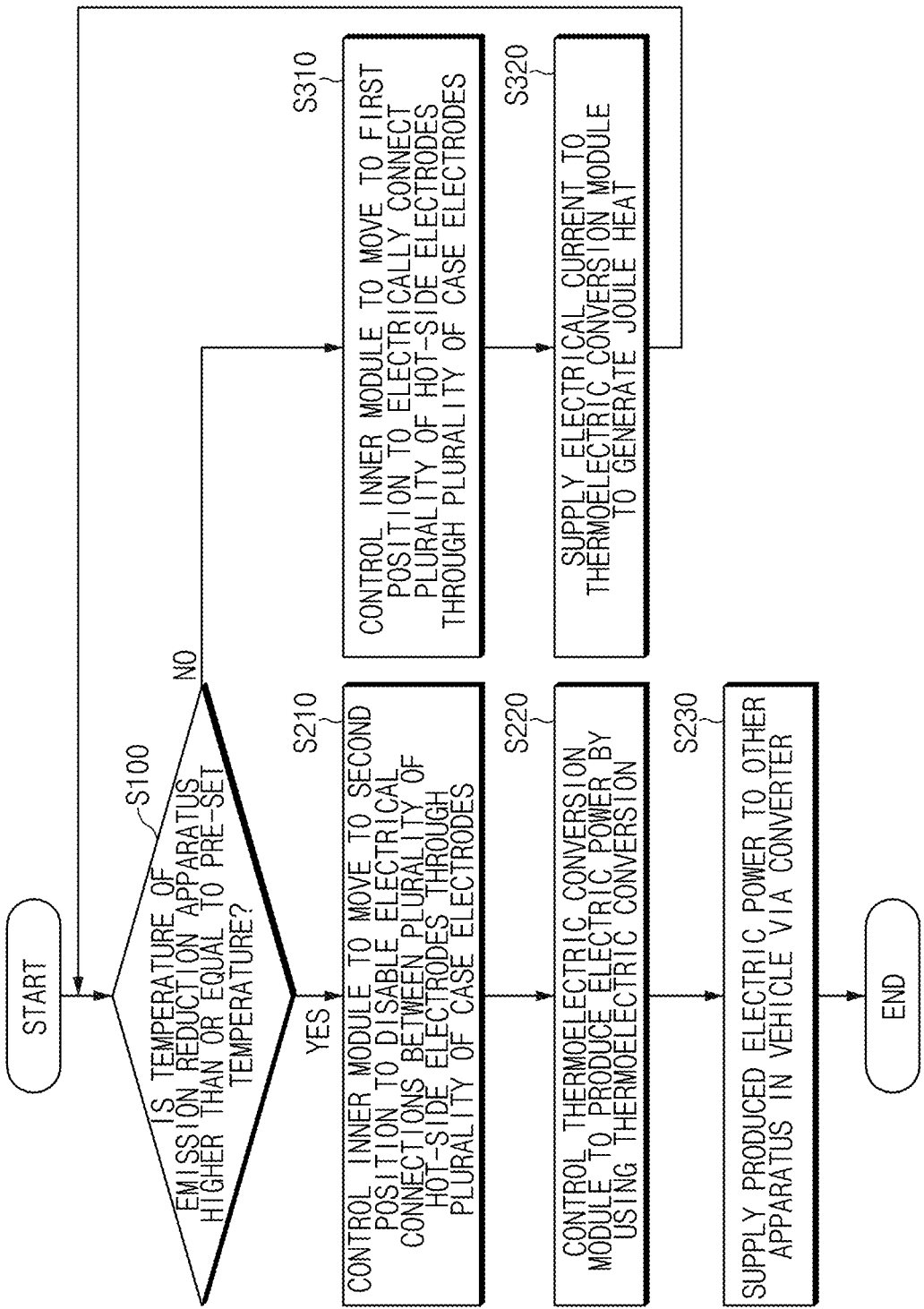
FIG. 6 is a flowchart illustrating a method for controlling a vehicle including the thermoelectric conversion module according to an exemplary embodiment of the present invention.

FIG. 6 is a flowchart illustrating a method for controlling a vehicle including the thermoelectric conversion module according to an exemplary embodiment of the present invention.

The vehicle including the thermoelectric conversion module according to the exemplary embodiment of the present invention may include an engine and an exhaust system including an emission reduction apparatus.

Furthermore, the vehicle may further include a switch. The switch may supply an electrical signal to switch the thermoelectric conversion module from a generating mode to a heating mode, or vice versa. Any switch configured for switching the operating mode of the thermoelectric conversion module may be used as the switch without any specific limitation.

For example, the switch may be controlled based on the temperature of the emission reduction apparatus, by use of a thermal actuator valve, a mechanical valve, an electronic valve, or the like.

The switch may supply an electrical signal to allow the thermoelectric conversion module to operate in the generating mode when the temperature of the emission reduction apparatus is higher than or equal to a pre-set temperature and in the heating mode when the temperature of the emission reduction apparatus is lower than the pre-set temperature.

The vehicle may further include a controller for controlling the overall configuration of the vehicle.

Referring to FIG. 6, the controller of the vehicle may determine whether the temperature of the emission reduction apparatus is higher than or equal to the pre-set temperature (Step S100). When the engine of the vehicle starts, the controller may be configured to determine whether the temperature of the emission reduction apparatus of the vehicle is higher than or equal to the pre-set temperature.

The controller may be configured to control the thermoelectric conversion module to receive an electrical current from a power supply in the vehicle and generate Joule heat when the engine of the vehicle starts.

The controller of the vehicle may control the thermoelectric conversion module to operate in the generating mode when it is determined that the temperature of the emission reduction apparatus is higher than or equal to the pre-set temperature.

When controlling the thermoelectric conversion module to operate in the generating mode, the controller of the vehicle may control the internal module 10 to move to the second position to disable electrical connections between the plurality of hot-side electrodes 13 through the plurality of case electrodes 21 and 22 (Step S210).

In an initial stage of the engine startup, the controller may be configured to control the internal module 10 to be located in the first position and the thermoelectric conversion module to operate in the heating mode. Thereafter, when the temperature of the emission reduction apparatus reaches the pre-set temperature or higher, the controller may be configured to control the internal module 10 to move to the second position to disable the electrical connections between the plurality of hot-side electrodes 13 through the plurality of case electrodes 21 and 22.

Thereafter, the controller of the vehicle may control the thermoelectric conversion module to produce electric power by use of thermoelectric conversion (Step S220).

Furthermore, the controller of the vehicle may control to supply the electric power produced by the thermoelectric conversion module to other parts in the vehicle through a converter (Step S230).

For example, the controller may be configured to control to supply the electric power produced by the thermoelectric conversion module to an alternator, reducing a load on the alternator.

Alternatively, the controller may be configured to control to supply the electric power produced by the thermoelectric conversion module to an energy storage device such as a battery to charge the battery.

The controller of the vehicle may control the thermoelectric conversion module to operate in the heating mode when it is determined that the temperature of the emission reduction apparatus is lower than the pre-set temperature.

When controlling the thermoelectric conversion module to operate in the heating mode, the controller may be configured to control the internal module 10 to move to the first position to allow the plurality of hot-side electrodes 13 to be electrically connected together by the plurality of case electrodes 21 and 22 (Step S310).

Thereafter, the controller may be configured to control to supply an electrical current to the thermoelectric conversion module to generate Joule heat (Step S320). For example, the controller may be configured to control to supply an electrical current from the energy storage device in the vehicle to the thermoelectric conversion module.

Accordingly, the emission reduction apparatus may be rapidly heated to a predetermined temperature at which emissions are effectively reduced, and the thermoelectric conversion module may generate electric power by use of heat in the emissions after the temperature of the emission reduction apparatus reaches the predetermined temperature or higher.

Consequently, the thermoelectric conversion module has advantages of increasing energy efficiency of the vehicle by use of waste heat while effectively reducing emissions.

Meanwhile, the vehicle may include a thermoelectric conversion module system including a plurality of thermoelectric conversion modules.

The plurality of thermoelectric conversion modules may be electrically connected together in series.

The plurality of thermoelectric conversion modules of the thermoelectric conversion module system may be disposed in the exhaust system of the vehicle to produce electric power by use of heat in emissions.

The thermoelectric conversion module system may include a controller configured for separately setting control modes of the plurality of thermoelectric conversion modules. The controller may be integrated with, or implemented separately from, the controller of the vehicle.

When an abnormal thermoelectric conversion module is among the plurality of thermoelectric conversion modules, the controller may be configured to control the abnormal thermoelectric conversion module to operate in a heating mode and the remaining normal thermoelectric conversion modules to operate in a generating mode, causing an electrical current produced by the normal thermoelectric conversion modules to flow through the abnormal thermoelectric conversion module.

In general, a thermoelectric conversion module may include a plurality of thermoelectric conversion elements that are connected in series by a plurality of electrodes. Hence, if any one of the thermoelectric conversion elements is damaged, electrical connection of the thermoelectric conversion module may be lost so that the thermoelectric conversion module cannot perform thermoelectric power generation.

However, the thermoelectric conversion module according to the exemplary embodiment of in various aspects of the present invention, electrical connections between the case electrodes 21 and 23 and the hot-side electrodes 13 allow an electrical current to flow through the thermoelectric conversion module even though any one of the thermoelectric conversion elements 11 and 12 is damaged.

Therefore, in the thermoelectric conversion module system including the plurality of thermoelectric conversion modules, an abnormal thermoelectric conversion module may be controlled to maintain only electrical connection, and the remaining normal thermoelectric conversion modules may be controlled to perform thermoelectric power generation, which makes it possible to efficiently operate the thermoelectric conversion module system.

In the above-configured thermoelectric conversion module of the present invention, a relative movement of the plurality of first electrodes and the plurality of case electrodes enables or disables connections between the plurality of first electrodes through the plurality of case electrodes. As a result, the thermoelectric conversion module may selectively operate in a heating mode in which an electrical current supplied from the outside thereof flows through the plurality of first electrodes and the plurality of case electrodes to generate Joule heat or in a generating mode in which electric power is produced using thermoelectric conversion.

For convenience in explanation and accurate definition in the appended claims, the terms "upper", "lower", "inner", "outer", "up", "down", "upper", "lower", "upwards", "downwards", "front", "rear", "back", "inside", "outside", "inwardly", "outwardly", "internal", "external", "inner", "outer", "forwards", and "backwards" are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. A thermoelectric conversion module comprising:
a plurality of n-type thermoelectric conversion elements and a plurality of p-type thermoelectric conversion elements alternating with one another;
a plurality of first electrodes and a plurality of second electrodes configured to alternately connect the plurality of alternating n-type and p-type thermoelectric conversion elements at hot sides and cool sides thereof;
a plurality of case electrodes, each of which selectively connects predetermined first electrodes adjacent to each other, among the plurality of first electrodes;
a case having the plurality of case electrodes on a surface of the case facing the plurality of first electrodes; and
an internal plate arranged to be slidable relative to the case, the case having a major surface extending laterally beyond a major surface of the internal plate, wherein the plurality of n-type thermoelectric conversion elements, the plurality of p-type thermoelectric conversion elements, the plurality of first electrodes, and the plurality of second electrodes are mounted on the internal plate,
wherein the plurality of first electrodes and the plurality of case electrodes are configured to be movable relative to each other so that the plurality of first electrodes are electrically connected through the plurality of case electrodes or electrical connections between the plurality of first electrodes through the plurality of case electrodes are disabled according to a relative movement of the plurality of first electrodes and the plurality of case electrodes, and
wherein a movement of the internal plate relative to the case allows the plurality of first electrodes mounted on the internal plate to move relative to the plurality of case electrodes.

2. The thermoelectric conversion module of claim 1, wherein electric power is produced by use of thermoelectric conversion while the electrical connections between the plurality of first electrodes through the plurality of case electrodes are disabled.

3. The thermoelectric conversion module of claim 1, further including:
a thermal actuator attached to one side of the internal plate and having an actuating portion configured to extend or retract depending on ambient temperature to move the internal plate,
wherein the internal plate is rectilinearly moved by the thermal actuator,
wherein the plurality of first electrodes are electrically connected together by the plurality of case electrodes when the internal plate is located in a first position, and
wherein the electrical connections between the plurality of first electrodes through the plurality of case electrodes are disabled when the internal plate is located in a second position.

4. The thermoelectric conversion module of claim 3, further including:
an elastic member attached to an opposite side of the internal plate which is opposite to the one side of the internal plate to which the thermal actuator is attached, the elastic member applying restoring force to the internal plate to allow the internal plate to return to an original position thereof before being moved by the thermal actuator.

5. The thermoelectric conversion module of claim 1, wherein the plurality of n-type thermoelectric conversion elements and the plurality of p-type thermoelectric conversion elements are mounted in rows and columns on the internal plate and electrically connected in series by the plurality of first electrodes and the plurality of second electrodes such that an electrical current generated by use of thermoelectric conversion flows along one of the rows from one side to an opposite side in a row direction thereof and then flows along another adjacent row from the opposite side thereof to the one side in the row direction thereof.

6. The thermoelectric conversion module of claim 5, wherein the plurality of first electrodes are mounted in rows and columns on the internal plate, and
wherein the plurality of case electrodes includes:
a plurality of row-wise case electrodes configured to connect the plurality of first electrodes in the row direction when the internal plate is located in a first position and to disable the electrical connections between the plurality of first electrodes in the row direction when the internal plate is located in a second position; and
a plurality of column-wise case electrodes configured to connect the plurality of first electrodes in a column direction when the internal plate is located in the first position and to disable connections between the plurality of first electrodes in the column direction when the internal plate is located in the second position.

7. The thermoelectric conversion module of claim 6, wherein the internal plate includes a sub-electrode configured to connect the plurality of case electrodes in the column direction when the internal plate is located in the first position and to disable the electrical connections between the plurality of case electrodes in the column direction when the internal plate is located in the second position.

8. The thermoelectric conversion module of claim 1, wherein the plurality of first electrodes or the plurality of case electrodes have rounded edge portions at which the plurality of first electrodes and the plurality of case electrodes make contact with each other when the internal plate moves toward the plurality of first electrodes or the plurality of case electrodes.

9. The thermoelectric conversion module of claim 8, wherein the plurality of first electrodes include the predetermined first electrodes that has one end portion that makes contact with a corresponding case electrode when the internal plate moves toward the plurality of first electrodes, and
wherein the one end portion of the predetermined first electrodes further extends in a movement direction of the internal plate and is curved toward an opposite side which is opposite to one side of the predetermined first electrodes with which the case electrode makes surface-to-surface-contact.

10. The thermoelectric conversion module of claim 1, wherein the case has a high-temperature surface on which the plurality of case electrodes is located and a low-temperature surface facing away from the high-temperature surface, and the low-temperature surface is subjected to coating to increase insulation and reduce a coefficient of friction.

11. The thermoelectric conversion module of claim 10, wherein the low-temperature surface of the case is coated with boron nitride (BN).

12. The thermoelectric conversion module of claim 1, wherein the plurality of case electrodes has a size corresponding to the plurality of the first electrodes such that the plurality of case electrodes is superimposed on the plurality of first electrodes in a one-to-one manner when the internal plate is located in the second position to produce electric power by use of thermoelectric conversion.

13. The thermoelectric conversion module of claim 1, wherein the plurality of case electrodes is formed of a material with higher resistance per unit area than a material forming the plurality of first electrodes.

14. The thermoelectric conversion module of claim 1, wherein the plurality of n-type thermoelectric conversion elements and the plurality of p-type thermoelectric conversion elements are separated from each other by an empty space or by an insulator.

15. A thermoelectric conversion module system comprising:
a plurality of thermoelectric conversion modules; and
a controller,
wherein each of the thermoelectric conversion modules includes:
 a plurality of n-type thermoelectric conversion elements and a plurality of p-type thermoelectric conversion elements alternating with one another;
 a plurality of hot-side electrodes and a plurality of cool-side electrodes configured to alternately connect the plurality of alternating n-type and p-type thermoelectric conversion elements at hot sides and cool sides thereof;
 a plurality of case electrodes, each of which selectively connects predetermined hot-side electrodes adjacent to each other, among the plurality of hot-side electrodes;
 a case having the plurality of case electrodes on a surface of the case facing the plurality of hot-side electrodes; and
 an internal plate arranged under the case to be slidable relative to the case, wherein the plurality of n-type thermoelectric conversion elements, the plurality of p-type thermoelectric conversion elements, the plurality of hot-side electrodes, and the plurality of cool-side electrodes are mounted on the internal plate,
wherein the plurality of hot-side electrodes and the plurality of case electrodes are configured to be movable relative to each other so that the plurality of hot-side electrodes are electrically connected through the plurality of case electrodes or electrical connections between the plurality of hot-side electrodes through the plurality of case electrodes are disabled according to a relative movement of the plurality of hot-side electrodes and the plurality of case electrodes,
wherein a movement of the internal plate relative to the case allows the plurality of hot-side electrodes mounted on the internal plate to move relative to the plurality of case electrodes, and
wherein the thermoelectric conversion module, according to control of the controller, operates in a heating mode in which the thermoelectric conversion module receives the electrical current to generate Joule heat while the plurality of hot-side electrodes are electrically connected together by the plurality of case electrodes, or the thermoelectric conversion module, according to control of the controller, operates in a generating mode in which the thermoelectric conversion module produces electric power by use of thermoelectric conversion while the electrical connections between the plurality of hot-side electrodes through the plurality of case electrodes are disabled.

16. The thermoelectric conversion module system of claim 15,
wherein the plurality of thermoelectric conversion modules includes at least a damaged thermoelectric conversion module which causes loss of electrical connection, and
wherein the controller is configured to control the at least a damaged thermoelectric conversion module to operate in the heating mode and a remaining normal thermoelectric conversion module among the plurality of thermoelectric conversion modules to operate in the generating mode, causing an electrical current produced by the remaining normal thermoelectric conversion module to flow through the at least a damaged thermoelectric conversion module.

17. A vehicle comprising:
an engine;
an exhaust system including an emission reduction apparatus; and
a thermoelectric conversion module attached to the emission reduction apparatus,
wherein the thermoelectric conversion module includes:
 a plurality of n-type thermoelectric conversion elements and a plurality of p-type thermoelectric conversion elements alternating with one another;
 a plurality of hot-side electrodes and a plurality of cool-side electrodes configured to alternately connect the plurality of alternating n-type and p-type thermoelectric conversion elements at hot sides and cool sides thereof;
 a plurality of case electrodes configured to connect the plurality of hot-side electrodes adjacent to each other;
 a case having the plurality of case electrodes on a surface of the case facing the plurality of hot-side electrodes; and
 an internal plate arranged to be slidable relative to the case, the case having a major surface extending laterally beyond a major surface of the internal plate, wherein the plurality of n-type thermoelectric conversion elements, the plurality of p-type thermoelectric conversion elements, the plurality of hot-side electrodes, and the plurality of cool-side electrodes are mounted on the internal plate,
wherein the plurality of hot-side electrodes and the plurality of case electrodes are configured to be movable relative to each other so that the plurality of hot-side electrodes are electrically connected through the plurality of case electrodes or electrical connections between the plurality of hot-side electrodes through the plurality of case electrodes are disabled according to a relative movement of the plurality of hot-side electrodes and the plurality of case electrodes, wherein a movement of the internal plate relative to the case allows the plurality of hot-side electrodes mounted on the internal plate to move relative to the plurality of case electrodes, and wherein the thermoelectric conversion module supplies the electrical current to the plurality of hot-side electrodes and the plurality of case electrodes to generate Joule heat while the plurality of hot-side electrodes are electrically connected together by the plurality of case electrodes, and the thermoelectric conversion module produces electric power while the electrical connections between the plurality of hot-side electrodes through the plurality of case electrodes are disabled.

18. The vehicle of claim 17, further including:

a switch, wherein the thermoelectric conversion module receives an electrical signal from the switch to transition from a heating mode for generating Joule heat to a generating mode for producing electric power by use of thermoelectric conversion, or to transition from the generating mode to the heating mode.

19. The vehicle of claim 17, wherein the thermoelectric conversion module is further configured to:

receive the electrical current from a power supply in the vehicle to generate Joule heat when the engine starts; and produce electric power by use of thermoelectric conversion when temperature of the emission reduction apparatus or emissions is higher than or equal to a pre-set temperature.

\* \* \* \* \*